US012148725B2

(12) United States Patent
Chuang et al.

(10) Patent No.: US 12,148,725 B2
(45) Date of Patent: Nov. 19, 2024

(54) BONDING STRUCTURES AND METHODS FOR FORMING THE SAME (71) Applicant: AG MATERIALS TECHNOLOGY CO., LTD., Hsinchu (TW)

(72) Inventors: Tung-Han Chuang, Hsinchu (TW); Hsing-Hua Tsai, Hsinchu (TW)

(73) Assignee: AG MATERIALS TECHNOLOGY CO., LTD., Hsinchu (TW)

( * ) Notice: Subject to any disclaimer, the term of this patent is extended or adjusted under 35 U.S.C. 154(b) by 336 days.

(21) Appl. No.: 17/699,048

(22) Filed: Mar. 18, 2022

(65) Prior Publication Data
US 2023/0027664 A1  Jan. 26, 2023

(30) Foreign Application Priority Data

Jul. 20, 2021 (TW) .................... 110126516

(51) Int. Cl.
*H01L 21/00* (2006.01)
*H01L 23/00* (2006.01)
(Continued)

(52) U.S. Cl.
CPC .............. *H01L 24/13* (2013.01); *H01L 24/11* (2013.01); *H01L 24/16* (2013.01); *H01L 24/17* (2013.01); *H01L 24/81* (2013.01); *H01L 25/0657* (2013.01); *H01L 25/074* (2013.01); *H01L 2224/1145* (2013.01);
(Continued)

(58) Field of Classification Search
CPC ........... H01L 24/13; H01L 24/11; H01L 24/16
See application file for complete search history.

(56) References Cited

U.S. PATENT DOCUMENTS 11,488,920 B2 * 11/2022 Tsai .................. H01L 24/03
11,837,568 B2 * 12/2023 Chuang .............. H01L 24/81
(Continued)

FOREIGN PATENT DOCUMENTS

CN    115642140 A  *  1/2023  ............ H01L 24/05
DE  102014101552 A1 *  8/2014  ............ B23K 1/0016
(Continued)

OTHER PUBLICATIONS

Japan Patent Office, Office Action. Patent Application Serial No. 2022-046091, Jan. 23, 2024, Japan.
(Continued)

*Primary Examiner* — Laura M Menz (57) ABSTRACT

A bonding structure is provided, including a first substrate; a second substrate disposed opposite the first substrate; a first bonding layer disposed on the first substrate; a second bonding layer disposed on the second substrate and opposite the first bonding layer; and a silver feature disposed between the first bonding layer and the second bonding layer. The silver feature includes a silver nano-twinned structure including parallel twin boundaries. The silver nano-twinned structure includes 90% or more [111] crystal orientation. A method for forming a bonding structure is also provided. Each of steps of forming a first silver feature and second silver feature includes sputtering or evaporation coating. Negative bias ion bombardment is applied to the first silver feature and second silver feature during sputtering or evaporation.

20 Claims, 7 Drawing Sheets (51) Int. Cl.
*H01L 25/065* (2023.01)
*H01L 25/07* (2006.01)

(52) U.S. Cl.
CPC ............... *H01L 2224/1147* (2013.01); *H01L 2224/13025* (2013.01); *H01L 2224/13083* (2013.01); *H01L 2224/13084* (2013.01); *H01L 2224/13124* (2013.01); *H01L 2224/13139* (2013.01); *H01L 2224/13147* (2013.01); *H01L 2224/13155* (2013.01); *H01L 2224/13166* (2013.01); *H01L 2224/13171* (2013.01); *H01L 2224/16148* (2013.01); *H01L 2224/17181* (2013.01); *H01L 2224/8109* (2013.01); *H01L 2224/81201* (2013.01); *H01L 2225/06513* (2013.01); *H01L 2225/06541* (2013.01); *H01L 2225/06565* (2013.01)

(56) References Cited

U.S. PATENT DOCUMENTS

| | | | | |
|---|---|---|---|---|
| 2014/0217593 | A1* | 8/2014 | Chen | H01L 24/29 257/762 |
| 2016/0046099 | A1* | 2/2016 | Chen | B32B 15/018 205/148 |
| 2018/0076167 | A1* | 3/2018 | Chuang | H01L 24/45 |
| 2021/0225793 | A1* | 7/2021 | Tsai | H01L 24/05 |
| 2022/0259754 | A1* | 8/2022 | Chen | C25D 3/38 |
| 2022/0336407 | A1* | 10/2022 | Chuang | H01L 24/32 |
| 2022/0344298 | A1* | 10/2022 | Chuang | H01L 24/27 |
| 2022/0388092 | A1* | 12/2022 | Chuang | B23K 20/16 |
| 2023/0027664 | A1* | 1/2023 | Chuang | H01L 24/13 |
| 2023/0057312 | A1* | 2/2023 | Chuang | C23C 14/16 |
| 2023/0090030 | A1* | 3/2023 | Chuang | C23C 30/00 257/782 |
| 2024/0158907 | A1* | 5/2024 | Chuang | C23C 14/46 |
| 2024/0170434 | A1* | 5/2024 | Chuang | H01L 24/29 |

FOREIGN PATENT DOCUMENTS

| | | | | |
|---|---|---|---|---|
| DE | 102022109920 | A1 * | 3/2023 | ............. H01L 24/05 |
| JP | 2021-072435 | | 5/2021 | |
| JP | 2023015978 | A * | 2/2023 | ............. H01L 24/05 |
| TW | 2015-42888 | | 11/2015 | |
| TW | I703226 | | 9/2020 | |
| TW | 202247498 | A * | 12/2022 | |
| TW | 202306077 | A * | 2/2023 | ............. H01L 24/05 |

OTHER PUBLICATIONS

Korea Patent Office, Office Action, Patent Application Serial No. 10-2022-0036132, Feb. 26, 2024, Korea.

Yu-Chang Lai et al., "Characterization of interfacial structure for low-temperature direct bonding of Si substrates sputtered with Ag nanotwinned films", Materials Characterization 175, Mar. 23, 2021, 12 pages, Elsevier, US.

Po-Ching Wu et al., "Enhancing effect of substrate bias on nanotwin formation of sputtered Ag thin films", J Mater Sci: Mater Electron (2021), Aug. 3, 2021, 8 pages, Springer, US.

Po-Ching Wu et al., "Evaporation of Ag nanotwinned films on Si substrates with ion beam assistance", IEEE Transactions on Components, Packaging, and Manufacturing Technology, Aug. 30, 2021, pp. 1-5, IEEE, US.

Pei-Ing Lee et al., "Formation of High Density of Textured Nanotwins in Evaporated Ag Thin Films through Post-deposition Ion Bombardment", IEEE Transactions on Components, Packaging, and Manufacturing Technology, Nov. 13, 2021, pp. 1-5, IEEE.

* cited by examiner

BONDING STRUCTURES AND METHODS FOR FORMING THE SAME

CROSS-REFERENCE TO RELATED APPLICATIONS

The present application claims priority of Taiwan Application No. 110126516, filed on Jul. 20, 2021, which is incorporated by reference herein in its entirety.

BACKGROUND

Technical Field

The disclosure relates to bonding structures and methods for forming the same, and more particularly to bonding structures having silver features and methods for forming the same.

Description of the Related Art

In a conventional technique, various single chip modules (such as analog chips, digital logic chips, memory chips) are arranged in parallel on a printed circuit board (PCB) to form an integrated circuit structure. However, the area of the printed circuit board is limited, and the distance between each chip is long, resulting in the disadvantage of signal delay. Therefore, a two-dimensional integrated circuit structure has subsequently been developed. That is a multichip module (MCM). The two-dimensional integrated circuit structure encapsulates different chips in the same module through the optimization of the manufacturing process. As the number of transistors continues to increase, a three-dimensional integrated circuit structure in which chips or wafers are vertically stacked has been further developed. The three-dimensional integrated circuit structure achieves a system in package (SiP), examples of which includes multichip package (MCP), stacked die, package on package (PoP), package in package (PiP), chip on wafer (CoW), and wafer on wafer (WoW).

The technique of the three-dimensional integrated circuit structure lies in heterogeneous integration. Heterogeneous integration turns different types of materials and components into a single system, thereby enhancing the performance of micro-opto-electro-mechanical systems (MOEMS), micro-electro-mechanical systems (MEMS), and nano-electro-mechanical systems (Nano-electro-mechanical systems, NEMS). The three-dimensional integrated circuit structure derived from heterogeneous integration allows the continuation of Moore's law. However, the three-dimensional integrated circuit still has some disadvantages, such as the influence of Joule heat during scaling down, wafer warpage, and the growth of solder intermetallic compound and the like. Among them, reliability degradation resulted from high temperature during the chip or wafer bonding processes is an urgent problem. Therefore, it is necessary to develop how to introduce low temperature bonding technology into the three-dimensional integrated circuit manufacturing process.

Conventional low-temperature bonding methods include: anodic bonding, solder bonding, surface activation bonding, ultrasonic bonding, and polymer glue bonding. However, the above methods have some disadvantages, such as: chip damage caused by high voltage incompatible with the chip applied in anode bonding; embrittlement of intermetallic compound (IMC) in solder bonding; high cost and damage to the chip in surface activation bonding; small application area in ultrasonic bonding; and difficulty of reworking the counter electrode in polymer glue bonding.

The (111) crystal plane of the metal having face-centered cubic (FCC) crystal structure is the most densely packed plane. Therefore, compared to the (100) or (110) crystal plane, it is easier to slide, the diffusion rate is higher, and the atomic diffusion rate is higher (for example, higher than about 3-4 orders of magnitude). In addition, nano twins have a high density of twin boundaries, which can provide a large number of atomic diffusion paths.

Taiwan Patent No. 16865724 and Taiwan Patent No. 1521104 disclose methods for electroplating copper nano-twinned films on surfaces of substrates, which can form parallel nano-twinned films on the substrates with high [111] crystal orientation. Taiwan Patent No. 16865724 discloses the method for low-temperature bonding through electroplating copper nano-twinned films, in which two oxide substrates covered by metal layers are bonded at a pressure of 0.8 MPa to 3 MPa and a temperature of 200° C. to 350° C. Taiwan Patent No. 1521104 discloses a package structure and method, which involves first electroplating copper seed layers on two substrates and then electroplating nickel nano-twinned films on the copper seed layers, and then bonding the two substrates. Taiwan Patent No. 1519681 discloses a structure and method, which involves electroplating gold nano-twinned films on surfaces of semiconductor chips, circuit boards or conductive substrates, and then bonding them to each other.

Although the conventional low-temperature bonding technique can form the parallel nano-twinned film on the substrate, it uses a high-speed rotary electroplating method at a speed of 50 rpm or even 1500 rpm, which makes it difficult to control the process and film quality. The resulting distance between parallel twin boundaries is large, and it includes less than 90% [111] crystal orientation. The XRD pattern in Taiwan Patent No. 1432613 shows that the crystal orientation of Cu is still obvious at (222). The XRD pattern in Taiwan Patent No. 1507548 shows that the crystal orientation of Au is still obvious at (222). Further, it includes only 50% [111] crystal orientation. In addition, although the semiconductor chips, circuit boards or conductive substrates are bonded through the nano-twinned film in conventional technique, it is necessary to perform chemical mechanical polishing (CMP) on the nano-twinned film before bonding to reduce the surface roughness. It not only complicates the process but also has the potential to damage the nano-twinned film.

Furthermore, the size of the components or contacts formed through an electroplating process may be limited and the waste produced by the electroplating process also has environmental concerns. In particular, components or contacts smaller than 2 μm generally cannot be produced through the electroplating process. In contrast, sputtering or evaporation coating does not have the concerns described above.

Components or contacts with a size smaller than 2 μm can be easily manufactured by sputtering or evaporation coating. In addition, as the nano-twinned film is directly plated on the silicon substrate, random coarse grains of at least 2 μm or more will be first formed and then be converted into a nano-twinned structure. That is, it is not feasible to directly form the nano-twinned film with the thickness of less than 2 μm on the surface of the silicon substrate. Therefore, it is not feasible to form the nano-twin structure for three-dimensional electrical contacts or hybrid circuits with a thickness of less than 2 μm. Further, the bonding force between the silicon substrate and the nano-twinned film is weak, which may also cause peeling and further decrease the reliability. In view of the various disadvantages of the conventional techniques, the semiconductor industry still faces challenges in existing wafer bonding techniques.

SUMMARY

Some embodiments of the present disclosure provide a bonding structure, including: a first substrate; a second substrate disposed opposite the first substrate; a first bonding layer disposed on the first substrate; a second bonding layer disposed on the second substrate and opposite the first bonding layer; and a silver feature disposed between the first bonding layer and the second bonding layer, wherein the silver feature includes a silver nano-twinned structure including parallel twin boundaries, wherein the parallel twin boundaries include 90% or more [111] crystal orientation.

In some embodiments, the thickness of the silver feature is at least 0.3 µm.

In some embodiments, the thickness of the silver nano-twinned structure is at least 0.1 µm.

In some embodiments, the distance between the parallel twin boundaries is between 1 nm and 100 nm.

In some embodiments, the silver feature further includes: a first transition grain layer between the first bonding layer and the silver nano-twinned structure; and a second transition grain layer between the second bonding layer and the silver nano-twinned structure.

In some embodiments, the silver feature includes 70% or more [111] crystal orientation.

In some embodiments, further including: a first via in the first substrate and connected to the first bonding layer; and a second via in the second substrate and connected to the second bonding layer.

In some embodiments, each of the first substrate and the second substrate includes silicon (Si) chip, Si wafer, or a combination thereof.

In some embodiments, each of the first bonding layer and the second bonding layer includes copper (Cu), aluminum (Al), silver (Ag), or a combination thereof.

Further embodiments of the present disclosure provide a method for forming a bonding structure, including: forming a first bonding layer on a first substrate; forming a first silver feature on the first bonding layer; forming a second bonding layer on a second substrate; forming a second silver feature on the second bonding layer; and bonding the first silver feature and the second silver feature to form a third silver feature between the first bonding layer and the second bonding layer, wherein the third silver feature includes a silver nano-twinned structure including parallel twin boundaries, wherein the parallel twin boundaries include 90% or more [111] crystal orientation.

In further embodiments, the thickness of the third silver feature is at least 0.3 µm, the thickness of the silver nano-twinned structure is at least 0.1 µm and the distance between the parallel twin boundaries is between 1 nm and 100 nm.

In further embodiments, each of the steps of forming the first silver feature and the second silver feature includes sputtering or evaporation coating.

In further embodiments, the bonding of the first silver feature and the second silver feature is performed at a temperature between 100° C. and 250° C.

In further embodiments, the bonding of the first silver feature and the second silver feature is performed at a pressure between 1 MPa and 30 MPa.

In further embodiments, the bonding of the first silver feature and the second silver feature is performed at a vacuum of $10^{-3}$ torr or higher.

In further embodiments, period of the bonding of the first silver feature and the second silver feature is between 10 minutes and 60 minutes.

In further embodiments, further including: forming a first transition grain layer between the first bonding layer and the silver nano-twinned structure; and forming a second transition grain layer between the second bonding layer and the silver nano-twinned structure.

In further embodiments, the third silver feature includes the first transition grain layer, the second transition grain layer and the silver nano-twinned structure, and the third silver feature includes 70% or more [111] crystal orientation.

In further embodiments, further including: forming a first via in the first substrate, wherein the first via is connected to the first bonding layer; and forming a second via in the second substrate, wherein the second via is connected to the second bonding layer.

In further embodiments, each of the first substrate and the second substrate includes Si chip, Si wafer, or a combination thereof and each of the first bonding layer and the second bonding layer includes copper (Cu), aluminum (Al), silver (Ag), nickel (Ni), titanium (Ti), chromium (Cr), or a combination thereof such as Cu/Ti, Cu/Ni and Cu/Cr.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Some variations of embodiments are described below. In different figures and illustrated embodiments, similar element symbols are used to indicate similar elements. It should be appreciated that additional operations can be provided before, during, and/or after the stages described in these embodiments. Some of the stages that are described can be replaced or eliminated for different embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Furthermore, when a number or a range of numbers is described with "about," "approximate," and the like, the term is intended to encompass numbers that are within a reasonable range including the number described, such as within +/— 10% of the number described or other values as understood by person skilled in the art. For example, the term "about 5 nm" encompasses the dimension range from 4.5 nm to 5.5 nm.

In addition, the use of ordinal terms such as "first", "second", "third", etc., in the disclosure to modify an element does not by itself connote any priority, precedence, or order of one claim element over another or the temporal order in which it is formed, but are used merely as labels to distinguish one claim element having a certain name from another element having the same name (but for use of the ordinal term) to distinguish the claim elements.

Embodiments of the present disclosure provide a bonding structure, including a silver feature having a silver nano-twinned structure disposed between two substrates. The entire silver feature includes 70% or more [111] crystal orientation and the silver nano-twinned structure within the silver feature includes 90% or more [111] crystal orientation. In addition to the characteristics of silver itself, the characteristics of the twin structure, such as better resistance to oxidation, resistance to corrosion, electrical conductivity, thermal conductivity, and high temperature stability, etc., make the bonding structure according to the embodiments of the present disclosure more applicable in three-dimensional integrated circuit packaging such as low temperature wafer on wafer and chip on wafer.

Figure 1A:
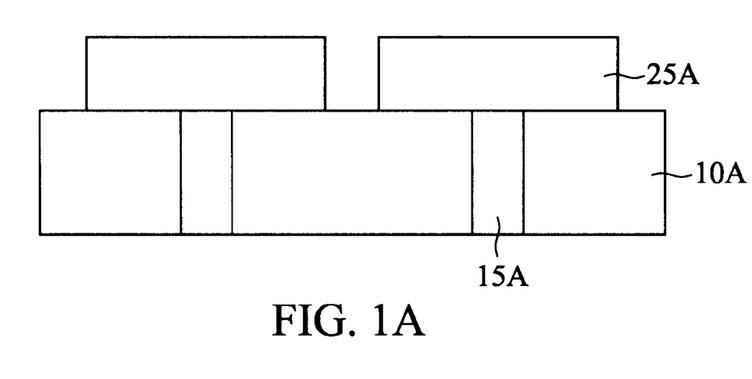
FIGS. 1A-1F are cross-sectional views of a bonding structure at various fabrication stages according to some embodiments of the present disclosure.

FIGS. 1A-1F illustrate cross-sectional views of a bonding structure at various fabrication stages according to some embodiments of the present disclosure. Referring to FIG. 1A, a first substrate 10A is provided. The first substrate 10A has a first bonding layer 25A thereon, and the first substrate 10A has a first via 15A connected to the first bonding layer 25A. In some embodiments, the first substrate 10A includes a semiconductor wafer, semiconductor chip, or a combination thereof. For example, the first substrate 10A includes element semiconductors, such as silicon (Si) and germanium (Ge); compound semiconductors, such as silicon carbide (SiC), gallium arsenide (GaAs), gallium phosphide (GaP), indium phosphide (InP), indium arsenide (InAs) and/or indium antimonide (InSb); alloy semiconductors, such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP) and/or gallium indium arsenide phosphide (GaInAsP); or a combination thereof.

In some embodiments, the first bonding layer 25A may include copper (Cu), aluminum (Al), silver (Ag), nickel (Ni), titanium (Ti), chromium (Cr), or a combination thereof such as Cu/Ti, Cu/Ni and Cu/Cr. The thickness of the first bonding layer 25A may be 0.01 µm to 10 µm, for example, 0.1 µm to 1.0 µm. In some embodiments, the first via 15A may be Si via.

In other embodiments, the first substrate 10A may additionally include an inter-metal dielectric (IMD) (not shown) and a protective layer (not shown). In some embodiments, the inter-metal dielectric may be silicon oxide, silicon nitride, borosilicate glass (BSG), phosphoric silicate glass (PSG), borophosphosilicate glass (BPSG), low-k materials, other suitable dielectric materials or a combination thereof. For example, an interconnection structure (not shown), a redistribution layer (RDL) (not shown) and the like may be disposed on the inter-metal dielectric. The protective layer may be silicon nitride, polyimide (PI), or a combination thereof. In addition, the first substrate 10A may include various passive and active devices (not shown), such as resistors, capacitors, inductors, diodes, field effect transistors (FETs), metal-oxide semiconductor FETs (MOSFETs), complementary metal-oxide semiconductor (CMOS) transistors, bipolar junction transistors (BJTs), laterally diffused MOS (LDMOS) transistors, high-voltage transistors, high-frequency transistors, other suitable devices, or a combination thereof. It should be understood that the structure shown in FIG. 1A is only an example, and the first substrate 10A may include additional features.

Figure 1B:
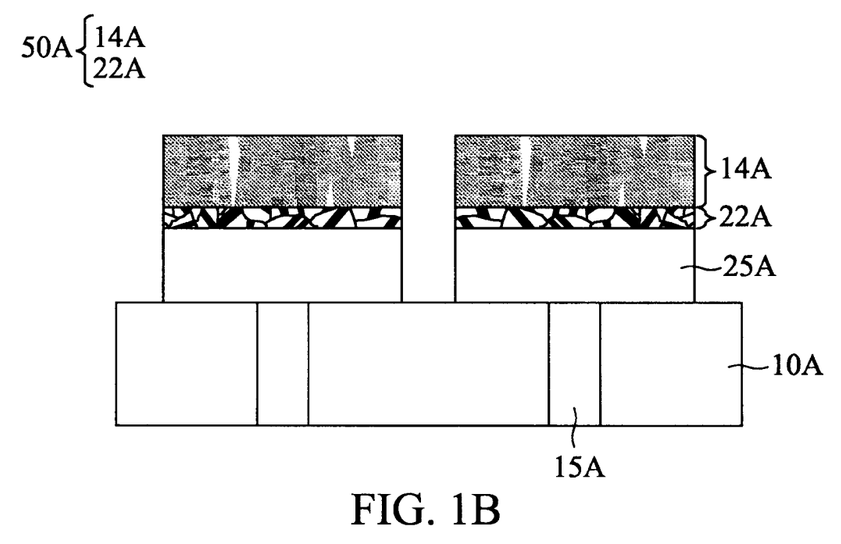

Referring to FIG. 1B, a first silver feature 50A is formed on the first bonding layer 25A. In some embodiments, the thickness of the first silver feature 50A may be 0.3 µm or more, for example, about 0.3 µm to about 10 µm. The first silver feature 50A includes a silver nano-twinned structure 14A. The thickness of the silver nano-twinned structure 14A is at least 0.1 µm. The silver nano-twinned structure 14A includes parallel twin boundaries ($\Sigma 3+\Sigma 9$), and the distance between the parallel twin boundaries may be, for example, 1 nm to 100 nm, preferably 2 nm to 50 nm. In some embodiments, the silver nano-twinned structure 14A includes parallel-stacked silver nano-twinned pillars. The diameters of the silver nano-twinned pillars may be 0.1 µm to 10 µm, preferably 0.3 µm to 1.0 µm.

Still referring to FIG. 1B, in some embodiments, in addition to the silver nano-twinned structure 14A, the first silver feature 50A also includes a transition grain layer 22A. When the first silver feature 50A is initially formed on the first bonding layer 25A, instead of the silver nano-twin structure 14A with parallel twin boundaries, the transition grain layer 22A without parallel twin boundaries will be formed first. In some embodiments, the thickness of the transition grain layer 22A may be less than 2.0 µm, for example, about 0.1 µm to about 1 µm.

In some embodiments, the first silver feature 50A may be formed on the first bonding layer 25A through sputtering. In some embodiments, the sputtering process may use single sputtering gun or multiple sputtering guns. In the sputtering process, the power source may be DC, DC plus, RF, or high-power impulse magnetron sputtering (HIPIMS). The process power for sputtering the first silver feature 50A may be, for example, about 100 W to about 500 W. The sputtering process is performed at room temperature; however, the temperature during the sputtering process may rise by about 50° C. to about 200° C. The background pressure of the sputtering process may be $1 \times 10^{-5}$ torr, and the working pressure may be, for example, about $1 \times 10^{-3}$ torr to $1 \times 10^{-2}$ torr. The flow rate of argon may be about 10 sccm to about 20 sccm. The rotation speed of the stage may be, for example, about 5 rpm to about 20 rpm. During the sputtering process, a negative bias ion bombardment with a voltage of about 0 V to about −300 V such as −100 V to about −200 V and a current of about 0 A to about 3.0 A such as 0.1 A to about 1.0 A is applied to the substrate. The deposition rate of the first silver feature 50A may be, for example, about 0.5 nm/s to about 3 nm/s. It should be understood that the sputtering process parameters described above may be appropriately adjusted according to practical applications, and are not intended to be limited.

In other embodiments, the first silver feature 50A may be formed on the first bonding layer 25A through evaporation coating. In some embodiments, the background pressure of the evaporation coating process may be $1\times10^{-5}$ torr, and the working pressure may be, for example, about $1\times10^{-4}$ torr to about $5\times10^{-4}$ torr. The flow rate of argon may be about 2 sccm to about 10 sccm. The rotation speed of the stage may be, for example, about 5 rpm to about 20 rpm. The deposition rate of the first silver feature 50A may be, for example, about 1 nm/s to about 5.0 nm/s. Additionally, a negative bias ion bombardment may be applied to the silver nano-twinned structure 14A with a voltage of about 0 V to about −300 V such as −10 V to about −200 V and a current of about 0 A to about 3.0 A such as 0.1 A to about 1.0 A during the evaporation coating process. It should be understood that the evaporation coating process parameters described above may be appropriately adjusted according to practical applications, and are not intended to be limited.

Compared with sputtering or evaporation coating process, sizes of components or contacts formed through the electroplating process may be limited. In particular, components or contacts generally smaller than 2 μm cannot be produced through the electroplating process. In contrast, components or contacts with sizes smaller than 2 μm can be easily manufactured by sputtering or evaporation coating process. In addition, as the nano-twinned film is directly plated on the silicon substrate, random coarse grains of at least 2 μm or more will be first formed and then be converted into a nano-twinned structure. That is, it is not feasible to directly form the nano-twinned film with the thickness of less than 2 μm on the surface of the silicon substrate. Therefore, it is not feasible to form the nano-twin structure for three-dimensional electrical contacts or hybrid circuits with a thickness of less than 2 μm. In some embodiments of the present disclosure, during a process of sputtering or evaporation coating, a negative bias with a voltage of 0 to −300 V is applied to the silver thin film, and a nano-twin structure with a thickness of at least 0.1 μm can be formed on the surface of the silver thin film with a thickness of less than 0.3 μm.

In some embodiments, the method for forming the first bonding layer 25A and the first silver feature 50A on the first substrate 10A may include: forming the first bonding layer 25A and the first silver feature 50A on the entire surface of the first substrate 10A; and performing a patterning process to remove portions of the first bonding layer 25A and the first silver feature 50A to form the structure as shown in FIG. 1B. In other embodiments, the method for forming the first bonding layer 25A and the first silver feature 50A on the first substrate 10A may include: providing a mask with openings on the first substrate 10A; forming the first bonding layer 25A and the first silver feature 50A on the first substrate 10A; and removing the mask and portions of layers outside the openings to form the structure as shown in FIG. 1B. It should be understood that the method described above is only an example and may be appropriately adjusted according to practical applications, thus is not limited thereto.

Figure 1C:
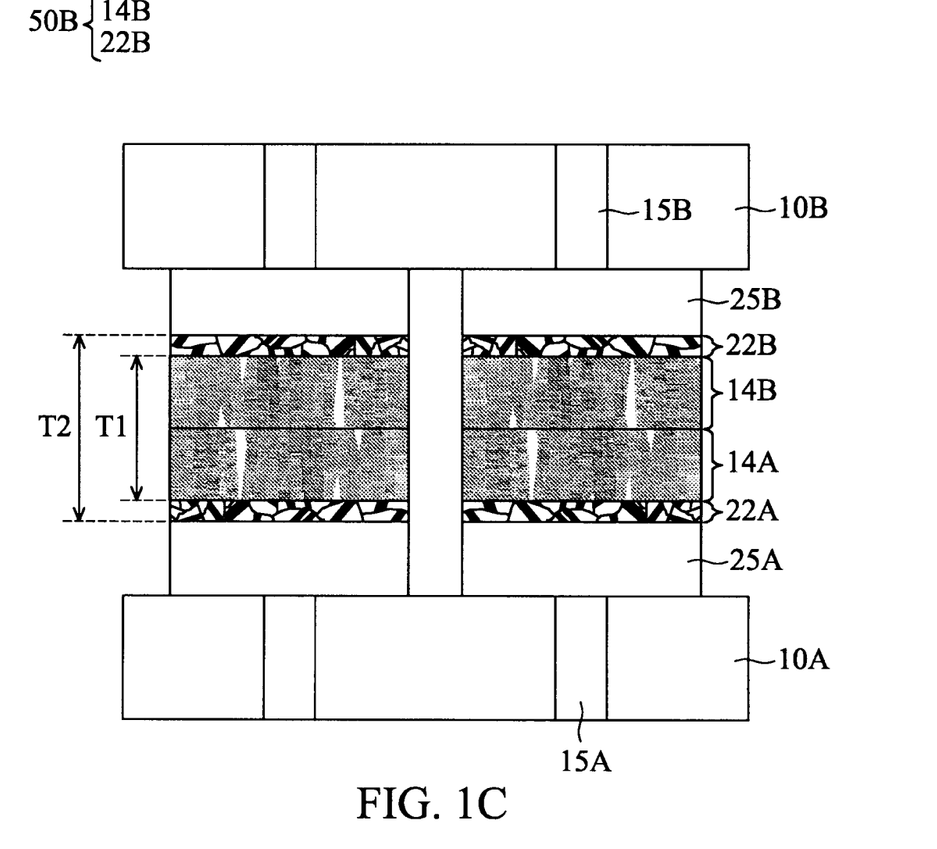

Referring to FIG. 1C, a second substrate 10B is provided. The second substrate 10B has a second bonding layer 25B thereon, and the second substrate 10B has a second via 15B connected to the second bonding layer 25B. The materials of the second substrate 10B, the second bonding layer 25B, and the second via 15B may refer to the embodiments described in FIG. 1A. Thus, it is not repeated herein. Subsequently, a second silver feature 50B is formed on the second bonding layer 25B. The second silver feature 50B includes a silver nano-twinned structure 14B and a transition grain layer 22B. The thickness and forming method of the second silver feature 50B may refer to the embodiments described in FIG. 1B. Thus, it is not repeated herein. It should be understood that the second substrate 10B, the second bonding layer 25B, the second via 15B, and the second silver feature 50B may be appropriately adjusted according to practical applications, and are not limited to the embodiments shown in FIGS. 1A and 1B.

Still referring to FIG. 1C, the first silver feature 50A and the second silver feature 50B are oppositely bonded to form a third silver feature (50A+50B) and a bonding structure. The third silver feature includes nano-twinned structure (14A+14B). In the cross-section view, the entire third silver feature includes 70% or more (such as greater than 70% or greater than 75%) [111] crystal orientation and the nano-twinned structure (14A+14B) includes 90% or more (such as greater than 90% or greater than 95%) [111] crystal orientation. The distance between the twin boundaries may be 1 nm to 100 nm, preferably 2 nm to 50 nm. In some embodiments, the thickness T1 of the silver nano-twinned structure (14A+14B) is at least 0.1 μm, for example, about 0.1 μm to about 8 μm, and the thickness T2 of the third silver feature (50A+50B) is at least 0.3 μm, for example about 0.3 μm to about 10 μm.

In practice, a nano-twinned film less than 0.1 μm in thickness will quickly and completely react with the bonding material during subsequent low-temperature wafer bonding and three-dimensional integrated circuit packaging. An intermetallic compound formed at the interface is unable to bond to the substrate, which may result in peeling. In other words, it is not suitable for use in practical applications.

In some embodiments, the bonding of the first silver feature 50A and the second silver feature 50B may be performed at a temperature of 100° C. to 250° C. (for example, about 100° C. to about 150° C. or about 150° C. to about 250° C.), at a pressure of 1 MPa to 30 MPa (for example, about 1 MPa to about 3 MPa or about 3 MPa to about 30 MPa) and at a vacuum of $10^{-3}$ torr or higher. In some embodiments, period of the bonding of the first silver feature 50A and the second silver feature 50B is between 10 minutes and 60 minutes (for example, about 10 minutes to about 30 minutes or about 30 minutes to about 60 minutes). After the bonding of the first silver feature 50A and the second silver feature 50B, the bonding structure still includes the nano-twinned structures 14A, 14B and retains the characteristics of the nano-twinned structure.

The embodiments of bonding two substrates described above are merely examples. It should be understood that the number of substrates may be increased to two or more, and bonding layers and silver features may be formed on front and back sides of various substrates for bonding, as shown in following FIGS. 1D-1F.

Figure 1D:
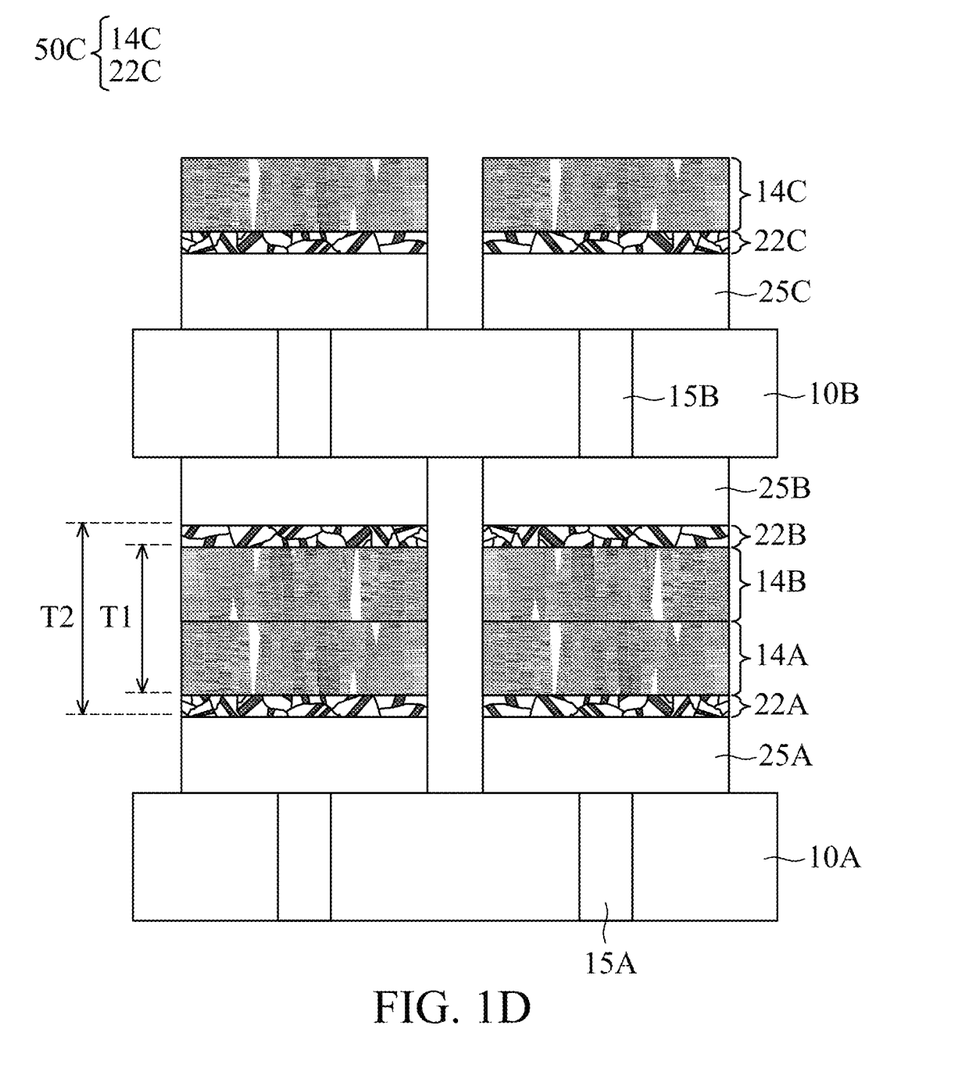
Figure 1E:
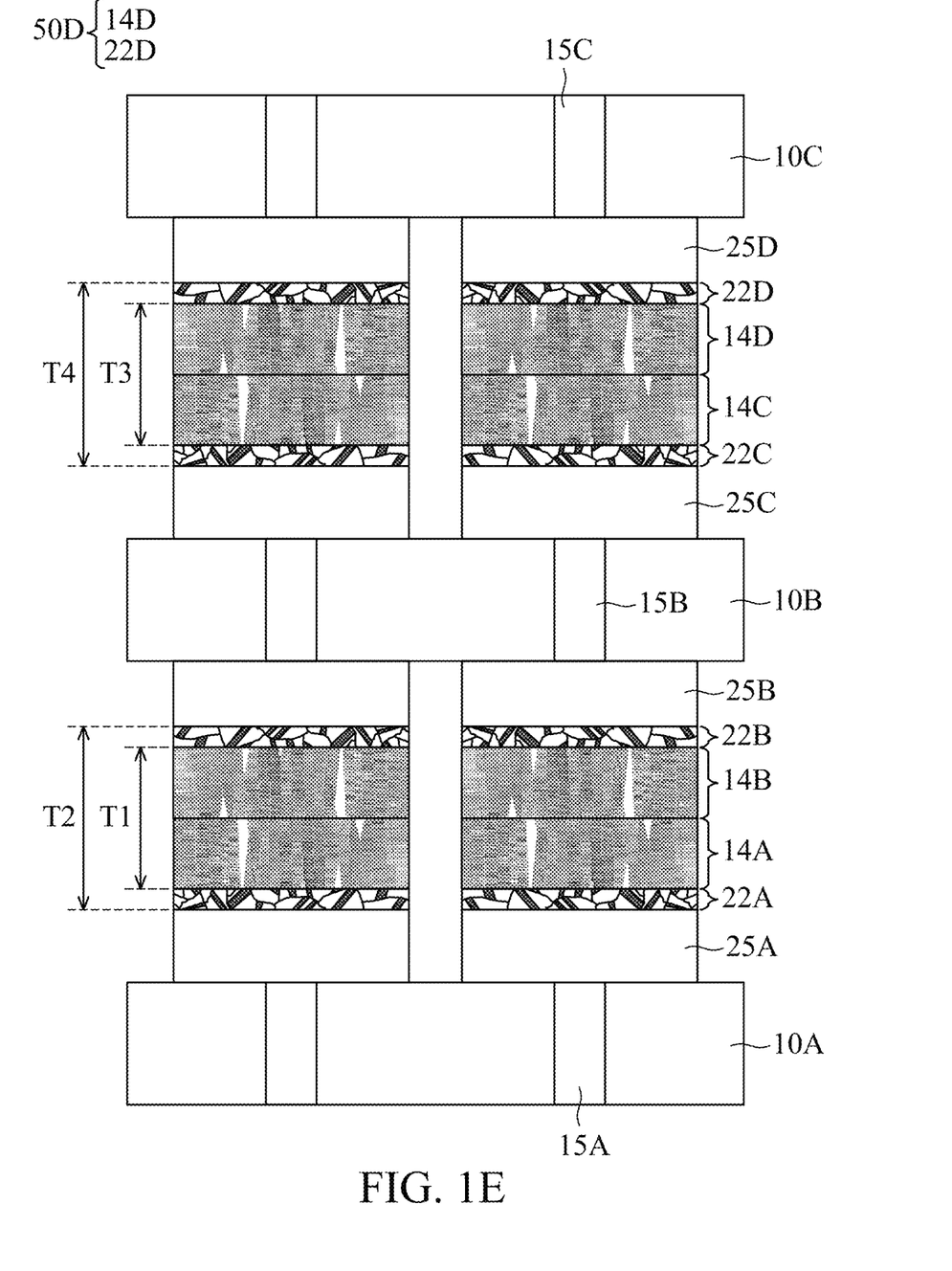

Referring to FIG. 1D, a third bonding layer 25C and the fourth silver feature 50C may be formed on the surface of the second substrate 10B opposite the second bonding layer 25B. Referring to FIG. 1E, a third substrate 10C is provided. The third substrate 10C has a fourth bonding layer 25D thereon, and the third substrate 10C has a third via 15C connected to the fourth bonding layer 25D. A fifth silver feature 50D may be formed on the fourth bonding layer 25D.

Subsequently, the fourth silver feature 50C and the fifth silver feature 50D are oppositely bonded to form a bonding structure. The materials and/or forming methods of the third substrate 10C, the third via 15C, the third bonding layer 25C, the fourth bonding layer 25D, the fourth silver feature 50C, and the fifth silver feature 50D as well as the thicknesses T3 and T4 may be referred to the embodiments shown in FIGS. 1A-1C. Thus, it is not repeated herein.

Figure 1F:
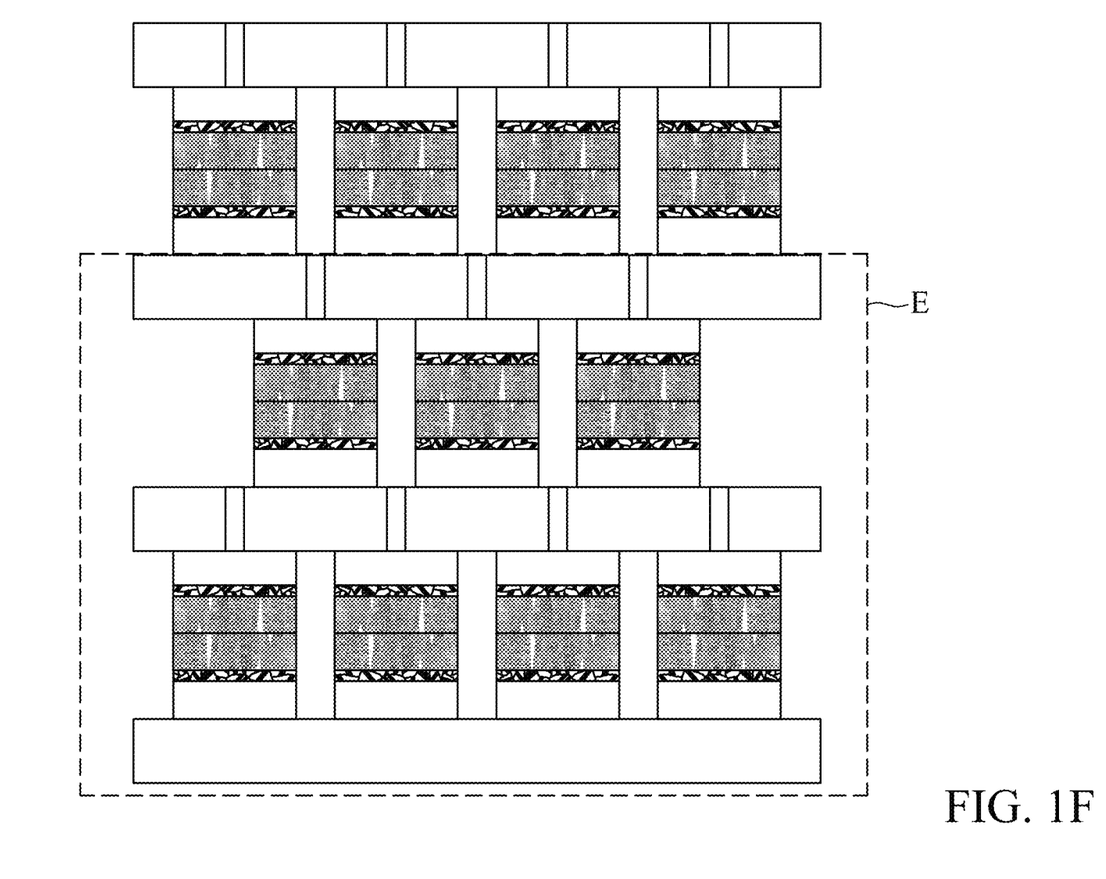

Referring to FIG. 1F, the region E may be the structure shown in FIG. 1E. It should be understood that FIG. 1F is merely an example to illustrate that number of substrate may be adjusted according to practical application to form a bonding structure with different numbers of layers.

In some embodiments, the bonding process of the present disclosure is performed at a pressure of 1 MPa to 30 MPa, which does not damage the substrate or silver nano twins. Although the bonding process can be performed at a low pressure of 0.8 MPa to 3 MPa in conventional technique, it is necessary to perform chemical mechanical polishing (CMP) on the nano-twinned film before bonding to reduce the surface roughness. It not only complicates the process but also has potential risk to damage the nano-twinned film. Compared with conventional technique, the present disclosure applies a greater pressure of about 1 MPa to about 30 MPa without damaging the substrate and the silver nano twins so that protrusions on the surface of the silver nano twins may undergo a nano-scale shaping to achieve the effect of close contact with the target. It not only solves the problem of surface roughness of silver nano twins, but also eliminates the need for additional chemical mechanical polishing or other surface treatment in conventional technique, which can substantially increase throughput and yield. In addition, the hardness of the copper nano twins in conventional technique is 4 GPa, which is about twice the hardness of the silver nano twins in the present disclosure.

If the nano-scale protrusions shaping mechanism of the present disclosure is applied to solve the problem of surface roughness of copper nano twins, it will be necessary to apply a pressure of more than 100 MPa, which will damage the substrate and the copper nano-twinned structure.

In addition, the resistivity of silver is 1.63 μΩ·cm, which is lower than that of copper (1.69 μΩ·cm), gold (2.2 μΩ·cm), and nickel (6.90 μΩ·cm). Therefore, silver has better electrical and thermal conductivity than copper, gold and nickel. The stacking fault energy of silver is 25 mJ/m², which is also lower than that of copper (70 mJ/m²), gold (45 mJ/m²), and nickel (225 mJ/m²). Therefore, silver is more likely to form twins than copper, gold and nickel.

Compared to the conventional technique (Taiwan Patent No. 1432613) for forming the copper nano-twinned thin film by electroplating, the diffusion rate of silver is more than 10 times faster than that of copper in the process for forming nano-twinned structure of present disclosure (LANDOLF-BORNSTEIN, Ed. H. Mehrer, Diffusion in Solid Metals and Alloys, Vol. 26, P. 75). Further, the melting point of silver is about 100° C. lower than that of copper. Therefore, subsequent wafer bonding processes can be performed at a lower temperature so that semiconductor devices are not affected by high temperature of the bonding processes. In particular, compared with the silver nano-twinned structure, the copper nano-twinned structure requires a higher temperature (for example, higher than 250° C.) for bonding. The higher temperature may damage the semiconductor device, and the small contact alignment may be failed due to the shrinkage of the material when the material is cooled to room temperature after the bonding process.

The hardness of silver nano twins is only about 2 GPa, which is softer than copper nano twins so that the surface roughness has little effect on the bonding process. In particular, when there is a difference in heights of tiny components or contacts, the problem of coplanarity is less likely to occur.

Furthermore, compared with copper nano-twinned films, silver nano-twinned films are less susceptible to oxidation, and a better bonding interface can be obtained. All of the characteristics described above show that the silver nano-twinned structure of present disclosure has the advantage of being suitable for practical application, especially for the needs of three-dimensional integrated circuit packaging such as wafer on wafer and chip on wafer.

The formation of twins is due to the accumulated strain energy inside a material. The strain energy drives uniform atomic shear to unsheared atoms at some regions inside the grain to form lattice positions that are mirror-symmetrical to each other. Twins include annealing twins and mechanical twins. The mutually symmetrical interface is the twin boundary.

Twins are mainly formed in face centered cubic (FCC) or hexagonal closed-packed (HCP) crystalline materials with the closest lattice arrangement. In addition to the crystal structure with the closest lattice arrangement, twins are more likely formed in materials with small stacking fault energy. For example, aluminum is a FCC crystal material, but its stacking fault energy is about 200 erg/cm². Therefore, twins are rarely formed in aluminum.

Twin boundaries are coherent crystal structures and are classified as Σ3 and n special grain boundaries with low interfacial energy. The crystal orientations are all {111}. Compared with high-angle grain boundaries formed by general annealing and recrystallization, the interfacial energy of twin boundaries is about 5% of the interfacial energy of high-angle grain boundaries (George E. Dieter, Mechanical Metallurgy, McGRAW-HILL Book Company, 1976, P. 135-141).

Due to the low interfacial energy of the twin boundaries, oxidation, sulfurization, and chloride ion corrosion may be avoided. Therefore, the silver nano-twinned thin film exhibits better resistance to oxidation and corrosion. In addition, the symmetrical lattice arrangement of twins is less likely to impede electron transportation. Therefore, the silver nano-twinned thin film exhibits better electrical and thermal conductivity. Because the twin boundaries inhibit the movement of dislocation, materials may still maintain high tensile strength. The characteristics of high tensile strength and electrical conductivity have been proven in the copper thin film. See Ultrahigh Strength and High Electrical Conductivity in Copper, Science, vol. 304, 2004, p. 422-426 issued to L. Lu, Y. Shen, X. Chen, L. Qian, and K. Lu.

In an aspect of high-temperature stability, twin boundaries are more stable than high-angle grain boundaries due to the low interfacial energy of twin boundaries. Twin boundaries are less likely to move at high temperatures. Twin boundaries may have an effect on locking surrounding high-angle grain boundaries, making the high-angle grain boundaries unable to move. Therefore, the grains may not grow significantly at high temperatures, which enable the tensile strength of the material to be maintained at high temperatures.

In an aspect of current reliability, since atoms have a low diffusion rate when passing through twin boundaries with low interfacial energy, it is difficult to move atoms inside the wire at a high current density during operation of electronic devices. As such, the electromigration that often occurs when current passes through a wire is inhibited. It has been proven that twins can inhibit electromigration in copper thin film. See Observation of Atomic Diffusion at Twin-Modified Grain Boundaries in Copper, Science, vol. 321, 2008, p. 1066-1069 issued to K. C. Chen, W. W. Wu, C. N. Liao, L. J. Chen, and K. N. Tu.

In semiconductor devices, the silver feature can be used as an electrode. As described above, compared with other metals (such as copper, gold, nickel, etc.) used as other bonding structure (such as pillar, solder, etc.), silver has lower resistivity, stacking fault energy and melting point. It is easier to form a nano-twinned structure and can be used in the low temperature and low pressure bonding process.

The embodiments of the present disclosure process the low temperature bonding through the silver nano-twinned structure. It can not only be used in the three-dimensional integrated circuit packaging industry, but also be used in the bonding of high-power chips and substrates, temperature-sensitive industries, and other devices (such as micro-electromechanical components (MEMS), light-emitting diodes (LED), micro-light-emitting diodes (Micro-LED), mini-light-emitting diodes (Mini-LED), biochips, sensors in the Internet of Things (IoT) system, actuators, heat-sensitive components and the like).

The following describes the formation and detection results of some working examples of the present disclosure in detail.

Example 1

Figure 2:
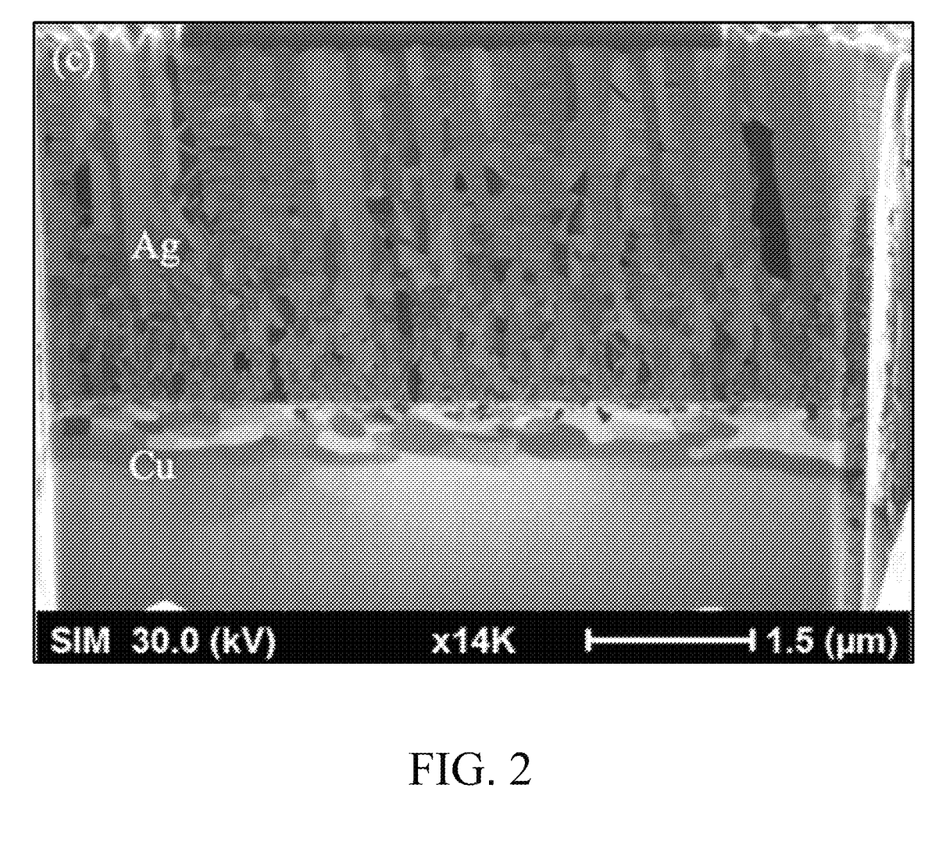
FIG. 2 is a focused ion beam (FIB) image of a silver feature on a single crystal silicon according to some embodiments of the present disclosure.

Referring to FIG. 2, a silver feature was sputtered on a surface of a copper bonding layer of a single crystal silicon substrate. A negative bias voltage of −100 V was applied to the silver thin film during sputtering. The image analyzed by FIB illustrated that the silver feature mainly included a parallel silver nano-twinned structure and a silver transition grain layer between the parallel silver nano-twinned structure and the copper bonding layer. The result of the analysis of the silver feature by the electron backscattered diffraction (EBSD) illustrated that the parallel silver nano-twinned boundaries included 98% or more [111] crystal orientation, and 85% or more of the entire silver feature was the silver nano-twinned structure with [111] crystal orientation.

Examples 2-6 (Corresponding to FIGS. 3A-3E, Respectively)

Figure 3A:
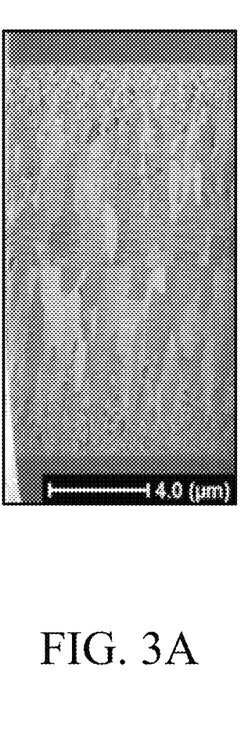
FIGS. 3A-3E are focused ion beam images of bonding structures formed at various temperatures according to other embodiments of the present disclosure.
Figure 3B:
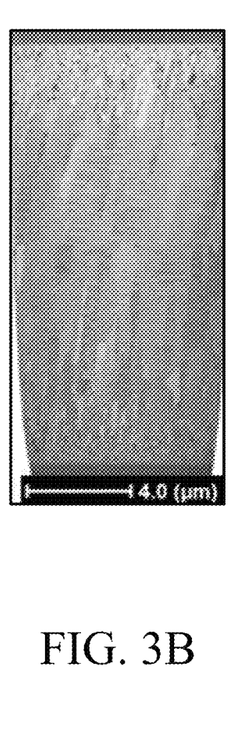
Figure 3C:
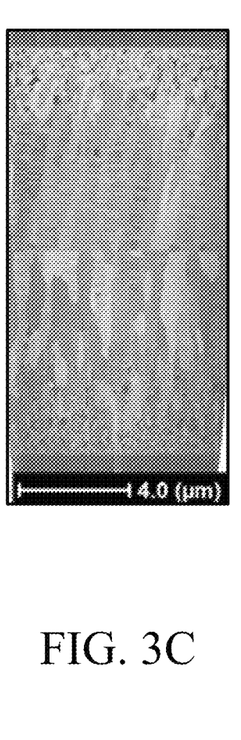
Figure 3D:
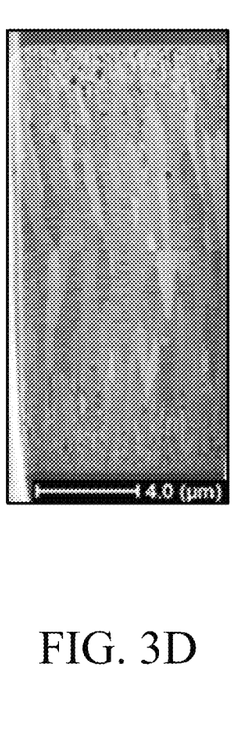
Figure 3E:
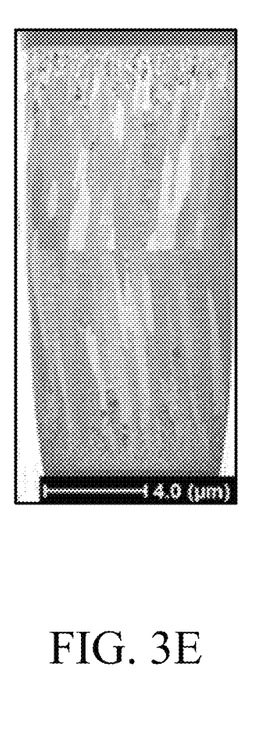

Silver features were sputtered on copper bonding layers of two Si chip, respectively. The two Si chips with silver features were oppositely bonded for 60 minutes at the pressure of 20 MPa, the vacuum of $10^{-3}$ torr, and the temperature of 100° C. The resulting FIB image is shown in FIG. 3A. The two Si chips with silver features were oppositely bonded for 30 minutes at the pressure of 20 MPa, the vacuum of $10^{-3}$ torr, and the temperature of 150° C. The resulting FIB image is shown in FIG. 3B. The two Si chips with silver features were oppositely bonded for 30 minutes at the pressure of 20 MPa, the vacuum of $10^{-3}$ torr, and the temperature of 200° C. The resulting FIB image is shown in FIG. 3C. The two Si chips with silver features were oppositely bonded for 30 minutes at the pressure of 20 MPa, the vacuum of $10^{-3}$ torr, and the temperature of 250° C. The resulting FIB image is shown in FIG. 3D. The two Si chips with silver features were oppositely bonded for 10 minutes at the pressure of 20 MPa, the vacuum of $10^{-3}$ torr, and the temperature of 250° C. The resulting FIB image is shown in FIG. 3E. The FIB images of Examples 2-6 all illustrated that the bonding interfaces did not include holes, and the parallel nano twins remained at the bonding interfaces between the copper bonding layers. The results of the analysis of the bonding interfaces between the copper bonding layers of Examples 2-6 by EBSD illustrated that the parallel silver nano-twinned boundaries included 98% or more [111] crystal orientation, and 85% or more of the entire silver feature was the silver nano-twinned structure with [111] crystal orientation.

Embodiments of the present disclosure have some advantageous features. In the cross-sectional view of the bonding structure, the silver nano-twinned structure includes the parallel twin boundaries with 90% or more [111] crystal orientation. The entire silver feature includes 70% or more [111] crystal orientation. Further, compared with other metals (such as copper, gold, nickel, etc.), silver has lower resistivity, stacking fault energy and melting point. It is easier to form a nano-twinned structure and can be used in the low temperature and low pressure bonding process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A bonding structure, comprising:
a first substrate;
a second substrate disposed opposite the first substrate;
a first bonding layer disposed on the first substrate;
a second bonding layer disposed on the second substrate and opposite the first bonding layer; and
a silver feature disposed between the first bonding layer and the second bonding layer, wherein the silver feature comprises a silver nano-twinned structure comprising parallel twin boundaries, wherein the parallel twin boundaries comprise 90% or more [111] crystal orientation.

2. The bonding structure as claimed in claim 1, wherein a thickness of the silver feature is at least 0.3 μm.

3. The bonding structure as claimed in claim 1, wherein a thickness of the silver nano-twinned structure is at least 0.1 μm.

4. The bonding structure as claimed in claim 1, wherein a distance between the parallel twin boundaries is between 1 nm and 100 nm.

5. The bonding structure as claimed in claim 1, wherein the silver feature further comprises:
a first transition grain layer between the first bonding layer and the silver nano-twinned structure; and
a second transition grain layer between the second bonding layer and the silver nano-twinned structure.

6. The bonding structure as claimed in claim 5, wherein the silver feature comprises 70% or more [111] crystal orientation.

7. The bonding structure as claimed in claim 1, further comprising:
a first via in the first substrate and connected to the first bonding layer; and a second via in the second substrate and connected to the second bonding layer.

8. The bonding structure as claimed in claim 1, wherein each of the first substrate and the second substrate comprises a silicon (Si) chip, a Si wafer, or a combination thereof.

9. The bonding structure as claimed in claim 1, wherein each of the first bonding layer and the second bonding layer comprises copper (Cu), aluminum (Al), silver (Ag), nickel (Ni), titanium (Ti), chromium (Cr), Cu/Ti, Cu/Ni, Cu/Cr or a combination thereof.

10. A method for forming a bonding structure, comprising:
    forming a first bonding layer on a first substrate;
    forming a first silver feature on the first bonding layer;
    forming a second bonding layer on a second substrate;
    forming a second silver feature on the second bonding layer; and
    bonding the first silver feature and the second silver feature to form a third silver feature between the first bonding layer and the second bonding layer, wherein the third silver feature comprises a silver nano-twinned structure comprising parallel twin boundaries, wherein the parallel twin boundaries comprise 90% or more [111] crystal orientation.

11. The method as claimed in claim 10, wherein a thickness of the third silver feature is at least 0.3 µm, a thickness of the silver nano-twinned structure is at least 0.1 µm and a distance between the parallel twin boundaries is between 1 nm and 100 nm.

12. The method as claimed in claim 10, wherein each of the steps of forming the first silver feature and the second silver feature comprises sputtering or evaporation coating, wherein a negative bias with a voltage of 0 to −300 V and a current of about 0 to about 3.0 A is applied to the first silver feature and the second silver feature during the sputtering or evaporation coating.

13. The method as claimed in claim 10, wherein the bonding of the first silver feature and the second silver feature is performed at a temperature between 100° C. and 250° C.

14. The method as claimed in claim 10, wherein the bonding of the first silver feature and the second silver feature is performed at a pressure between 1 MPa and 30 MPa.

15. The method as claimed in claim 10, wherein the bonding of the first silver feature and the second silver feature is performed at a vacuum of $10^{-3}$ torr or higher.

16. The method as claimed in claim 10, wherein period of the bonding of the first silver feature and the second silver feature is between 10 minutes and 60 minutes.

17. The method as claimed in claim 10, further comprising:
    forming a first transition grain layer between the first bonding layer and the silver nano-twinned structure; and
    forming a second transition grain layer between the second bonding layer and the silver nano-twinned structure.

18. The method as claimed in claim 17, wherein the third silver feature comprises the first transition grain layer, the second transition grain layer and the silver nano-twinned structure, and the third silver feature comprises 70% or more [111] crystal orientation.

19. The method as claimed in claim 10, further comprising:
    forming a first via in the first substrate, wherein the first via is connected to the first bonding layer; and
    forming a second via in the second substrate, wherein the second via is connected to the second bonding layer.

20. The method as claimed in claim 10, wherein each of the first substrate and the second substrate comprises a Si chip, a Si wafer, or a combination thereof and each of the first bonding layer and the second bonding layer comprises copper (Cu), aluminum (Al), silver (Ag), nickel (Ni), titanium (Ti), chromium (Cr), Cu/Ti, Cu/Ni, Cu/Cr or a combination thereof.

* * * * *